United States Patent
Chen

(10) Patent No.: US 7,135,919 B2
(45) Date of Patent: Nov. 14, 2006

(54) POWER AMPLIFIER WITH SWITCHABLE LOAD

(75) Inventor: Pin-fan Chen, Fremont, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 41 days.

(21) Appl. No.: 10/913,051

(22) Filed: Aug. 6, 2004

(65) Prior Publication Data

US 2006/0028269 A1 Feb. 9, 2006

(51) Int. Cl.
*H03F 1/14* (2006.01)
(52) U.S. Cl. .............. 330/51; 330/124 R; 330/302
(58) Field of Classification Search .............. 330/51, 330/124 R, 295
See application file for complete search history.

(56) References Cited

U.S. PATENT DOCUMENTS 5,541,554 A * 7/1996 Stengel et al. ............... 330/51
6,208,203 B1 * 3/2001 Jung et al. .................. 330/51
6,838,941 B1 * 1/2005 Yamamoto et al. ......... 330/295
6,865,399 B1 * 3/2005 Fujioka et al. ............. 455/127.2

OTHER PUBLICATIONS

Joon Hyung Kim, Ji Hoon Kim, Youn Sub Noh and Chul Soon Park, "An InGaP-GaAs HBT MMIC Smart Power Amplifier for W-CDMA Mobile Handsets" IEEE Journal of Solid-State Circuits, vol. 38, No. 6, pp. 905-910, Jun. 2003.

* cited by examiner

Primary Examiner—Khanh Van Nguyen

(57) ABSTRACT

Power amplifier with switchable load. A first amplifier that includes an output electrode is provided. A second amplifier that includes an output electrode is also provided. A switchable load that receives a control signal selectively presents a first impedance to the first amplifier when the first amplifier is operational, and the second amplifier is not utilized, and presents a second impedance to the second amplifier when the second amplifier is operational, and the first amplifier is not utilized based on the control signal.

19 Claims, 6 Drawing Sheets

POWER AMPLIFIER WITH SWITCHABLE LOAD

BACKGROUND OF THE INVENTION

CDMA (code-division, multiple access) requires that all signals received at a base station from handsets (e.g., cell phone) have about the same power level. When signals of differing power levels are received by the base station, undesirable interference is introduced into the system. In this regard, the handset utilizes different amounts of power to transmit signals to the base station depending on the distance from the base station. For example, when a handset is close to a base station, the handset uses less power to transmit the signal. Similarly, when a handset is far from a base station, the handset uses more power to transmit the signal.

Consequently, an important component in handsets, especially CDMA handsets, is a power amplifier integrated circuit that provides power management. A power amplifier is most efficient when the amplifier is operated at the maximum voltage. For example, a typical power amplifier can generate a maximum of about 26 dBm of power or about 0.4 watts (400 mW). However, most of the time the handset operates with a mid-range power (e.g., between 10 to 16 dBm of power or about 40 mW) because the handset may be closer to a base station.

One approach to improve power amplifier efficiency is to vary the supply voltage as a function of output power. For example, a DC to DC converter may be utilized to down convert from a first voltage to a second voltage (V_1 to V_2). One disadvantage of this approach is that this transformer-based approach utilizes magnetic components that are relatively large. Consequently, this approach is not conducive for space-efficient designs, which is the current trend. For example, as the handsets decrease in size or as more functions are integrated into the handsets, the space that is allocated to power management and control is rapidly decreasing.

Another approach to employ two separate power amplifiers, one power amplifier for high power and another power amplifier for low power. Unfortunately, when the high power amplifier is on, and the low power amplifier is off, the load for the low power amplifier acts as parasitic impedance that dissipates power, thereby decreasing battery life, which translates into less talk time for cellular telephones.

Based on the foregoing, there remains a need for a mechanism to improve power amplifier efficiency by varying the load impedance as a function of output power that overcomes the disadvantages set forth previously.

SUMMARY OF THE INVENTION

According to one embodiment of the present invention, a power amplifier with switchable load. A first amplifier that includes an output electrode is provided. A second amplifier that includes an output electrode is also provided. A switchable load that receives a control signal selectively presents a first impedance to the first amplifier when the first amplifier is operational, and the second amplifier is not utilized, and presents a second impedance to the second amplifier when the second amplifier is operational, and the first amplifier is not utilized based on the control signal.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Figure 1:
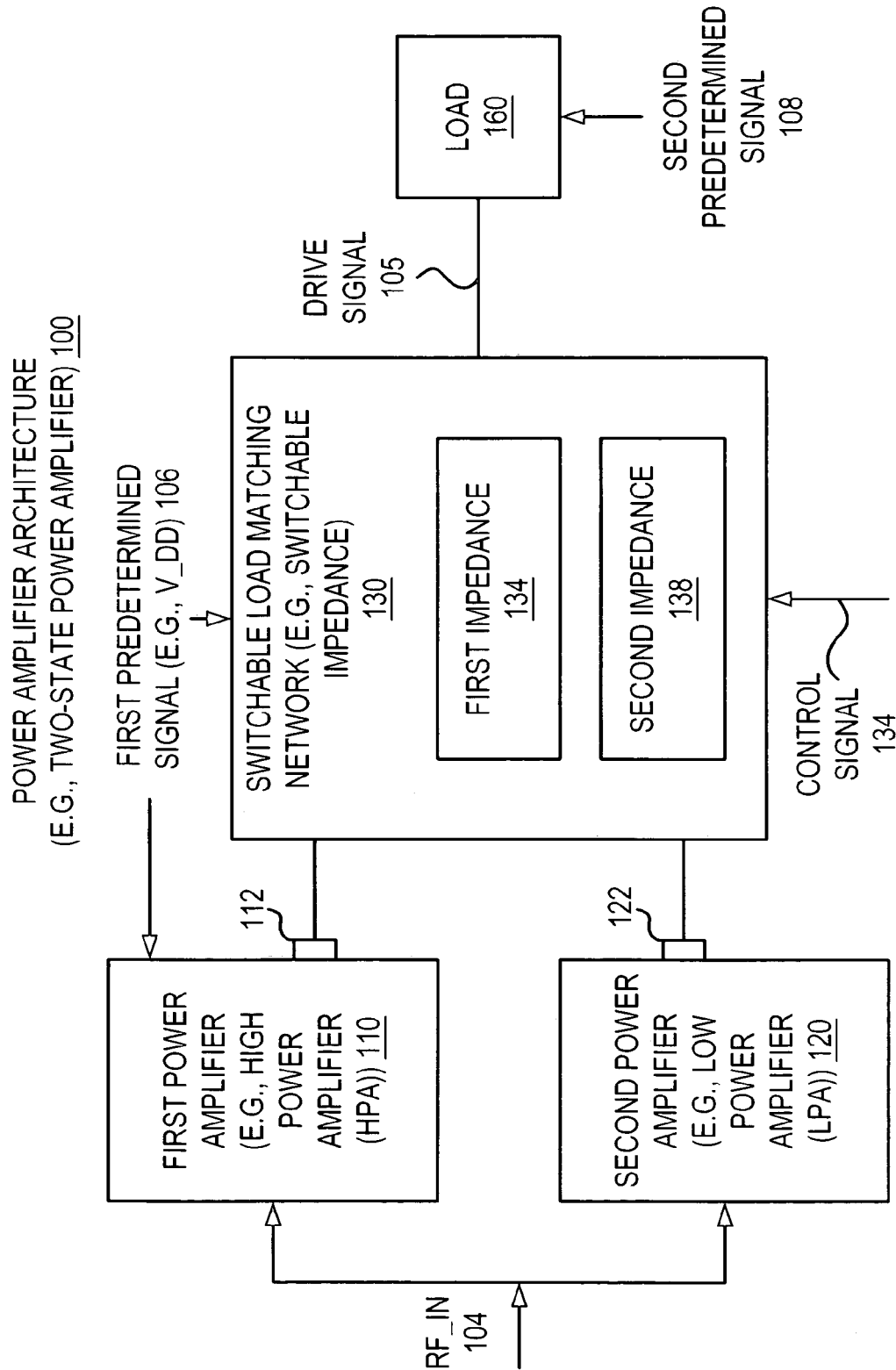
FIG. 1 illustrates a block diagram of a power amplifier architecture according to one embodiment of the invention.

A power amplifier with switchable load is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Power Amplifier 100 Architecture

The power amplifier architecture 100 can be a two-state power amplifier that has a first state, which is a low power setting state, that conserves energy (e.g., extends life of battery) and a second state, which is a high power setting, used to transmit signals. The power amplifier 100 includes an input for receiving an input signal (e.g., an RF signal, RF_in) and provides a drive signal 105 (e.g., a drive current) to a load (R_L) 160, which can be, for example, an antenna (e.g., a 50 ohm antenna).

The power amplifier architecture 100 includes a first power amplifier 110 (which is referred to herein also as a high power amplifier (HPA) that includes an output electrode 112 and a second power amplifier 120 (which is referred to herein also as a low power amplifier (LPA) that includes an output electrode 122.

The power amplifier architecture 100 also includes a switchable load matching network (SLMN) 130. The switchable load matching network (SLMN) 130 is also referred herein as a switchable impedance matching network, a switchable impedance, or a switchable load.

The switchable impedance 130 is controlled by a control signal 134. Based on the control signal 134, the switchable load 130 selectively presents 1) a first impedance (e.g., first load) 134 to the first amplifier 110 when the first amplifier 110 is operational, and the second amplifier 120 is not utilized; and 2) presents a second impedance (e.g., second load) 138 to the second amplifier 120 when the second amplifier is operational 120, and the first amplifier 110 is not utilized.

The switchable load matching network (SLMN) 130 provides a first impedance 134 to match the load of the first power amplifier 110 when the first power amplifier (HPA) 110 is on, and the second power amplifier (LPA) 120 is disabled. The switchable load matching network (SLMN) 130 provides a second impedance 138 to match the load of the second power amplifier 120 when the second power amplifier (LPA) 120 is on, and the first power amplifier (HPA) 110 is disabled.

When the high power amplifier 110 is on, SLMN 130 switches off the load for the low power amplifier 120. By so doing, the SLMN 130 prevents the load for the low power amplifier 120 from acting as a parasitic impedance that dissipates or wastes the power intended to go into the load 160 (e.g., an antenna).

It is noted that a first predetermined signal (e.g., V_DD signal) 106 and a second predetermined signal 108 (e.g., a ground signal) are provided to various components (e.g., the amplifiers 110, 120 and the switchable load 130) of the power amplifier 100. In one embodiment, the predetermined signal 106 is a power supply voltage signal that is in the range of about 2.5V to 3.5V, and the second predetermined signal 108 is a ground potential signal.

According to one embodiment of the invention, a first amplifier that includes an output electrode delivers a maximum level power into a low impedance load. A second amplifier that includes an output electrode delivers medium level power into a low impedance load. A quarter-wave transmission line is provided that includes a first electrode coupled to the output electrode of the first amplifier and a second electrode coupled to the output electrode of the second amplifier. The quarter-wave transmission line transforms a low impedance (e.g., R_L) into $(Z\_m)^2/R\_L$, where Z_m is the impedance of the quarter-wave transmission line.

Switchable Load 130

Figure 2:
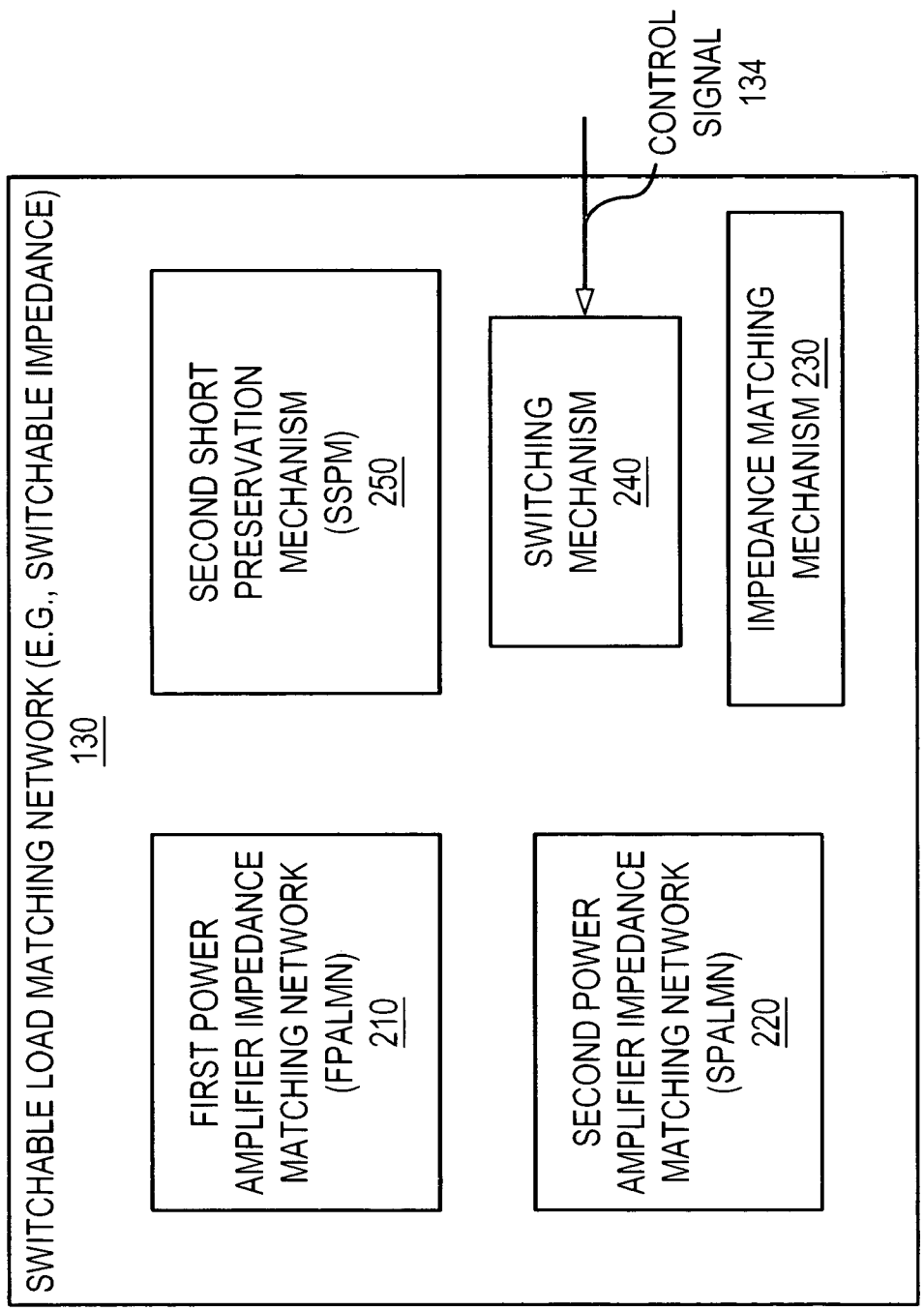
FIG. 2 illustrates in greater detail the switchable load of FIG. 1 according to one embodiment of the invention.

FIG. 2 illustrates in greater detail the switchable load 130 of FIG. 1 according to one embodiment of the invention. The switchable load matching network (SLMN) 130 includes a first power amplifier impedance matching network 210 that matches the load of the first power amplifier. The first power amplifier impedance matching network 210 is also referred to herein as a high power amplifier impedance matching network 210.

The switchable load matching network (SLMN) 130 also includes a second power amplifier impedance matching network 220 that matches the load of the second power amplifier. The second power amplifier impedance matching network 220 is also referred to herein as a low power amplifier impedance matching network 220.

The SLMN 130 also includes a switching mechanism 240 (e.g., a switching circuit) that receives a control signal 134 and based thereon selectively provides either a first load through the first power amplifier impedance matching network 210 or a second load through the second power amplifier impedance matching network 220. The switchable load 130 also includes a second short preservation mechanism (SSPM) 250 that preserves a second harmonic short as described in greater detail hereinafter and an impedance matching mechanism 230, which is also described hereinafter.

Figure 3:
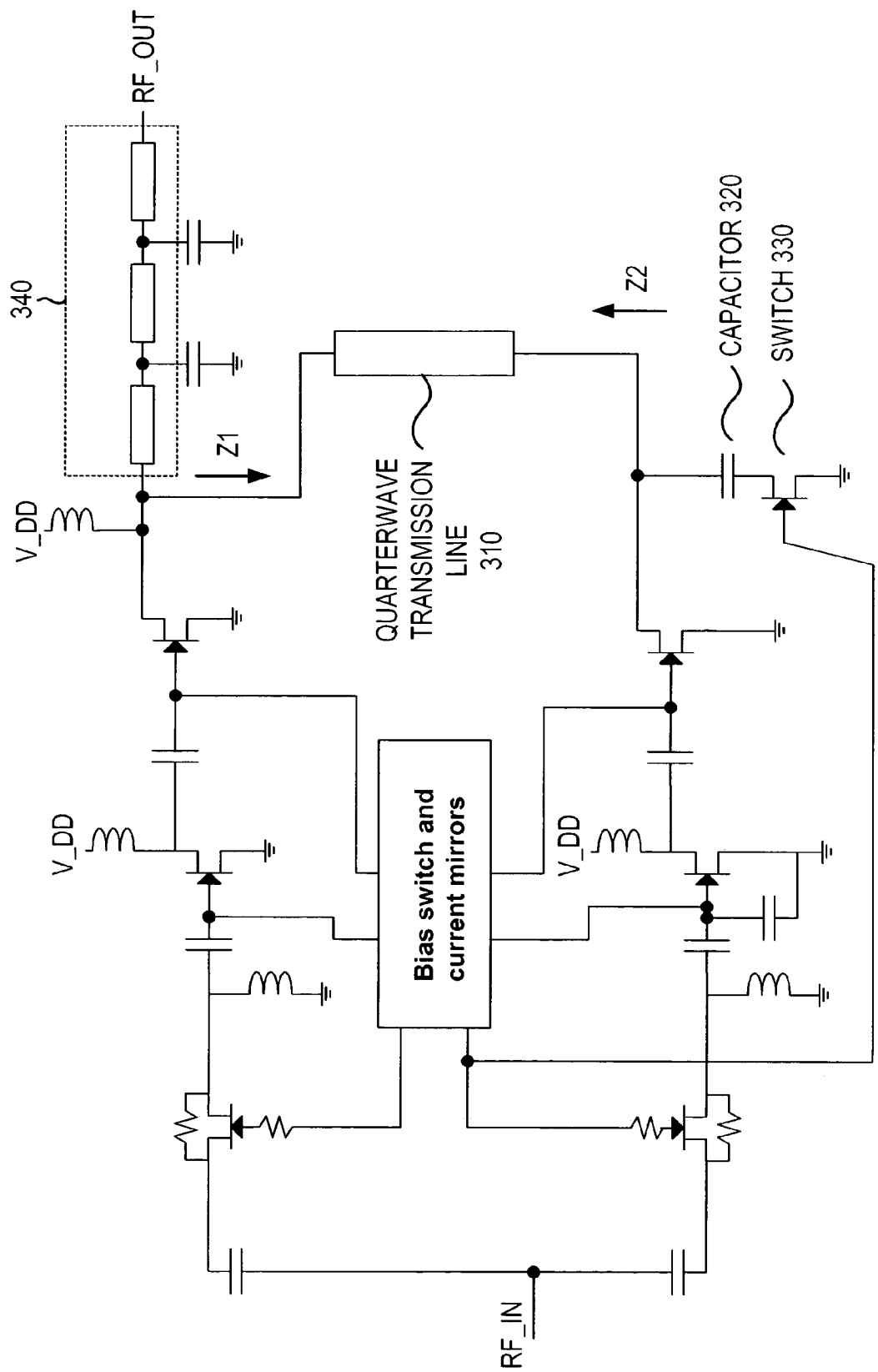
FIG. 3 illustrates a circuit diagram of the power amplifier of FIG. 1 according to one embodiment of the invention.

FIG. 3 illustrates a circuit diagram of the power amplifier of FIG. 1 according to one embodiment of the invention. The first amplifier 110 can include a driver amplifier and a power amplifier. The driver amplifier can be implemented with a first field effect transistor (FET), and the power amplifier can be implemented with a second field effect transistor (FET). Similarly, the first amplifier 110 can include a driver amplifier and a power amplifier. The driver amplifier can be implemented with a third field effect transistor (FET), and the power amplifier can be implemented with a fourth field effect transistor (FET).

In this embodiment, the switchable impedance 130 can include a quarterwave transmission line 310, a capacitor 320, and a switch 330. The quarterwave transmission line 310 includes a first electrode for coupling to the output electrode of the first amplifier 110 and a second electrode for coupling to the output electrode of the second amplifier 120. The impedance value of the quarterwave transmission line 310 can be selected to suit the requirements of a particular application. In one embodiment, values of about 15 to 16 ohms are utilized for Z_m.

The capacitor 320 includes a first electrode that is coupled to the second electrode of the transmission line 310 and a second electrode. The value of capacitor 320 can be selected to suit the requirements of a particular application. In one embodiment, values of about 10 pF to 50 pF are utilized for PCS frequencies (e.g., 1900 MHz). In another embodiment, values of about 20 pF or greater are utilized for Cellular frequencies (e.g., 800 MHz to 900 MHz).

The switch 330 can be a transistor (e.g., a field effect transistor (FET)) that includes a gate electrode, a drain electrode, and a source electrode. The gate electrode receives a control signal (e.g., control signal 134). The drain electrode is coupled to a second electrode of the capacitor 320. The source electrode is coupled to a predetermined signal 108 (e.g., a ground potential). Based on the control signal, the switch 330 selectively couples the second electrode of the capacitor 320 to the predetermined signal.

In this embodiment, the second short preservation mechanism (SSPM) 250 that preserves a second harmonic short is realized with a quarter wave transmission line 310. The quarter wave transmission line 310 can be an impedance transformer with an impedance of Z_m and a L-value of (0.25*λ).

In another embodiment, the second short preservation mechanism (SSPM) 250 that preserves a second harmonic short may be realized with a lump element representation of an impedance transformer. It is noted that a second harmonic short is typically built into the load (R_L) 160. The second short preservation mechanism (SSPM) 250 preserves this property of the load 160, thereby increasing the efficiency of the second power amplifier 120. Exemplary implementations of the quarter wave transmission line 310 are described in greater detail hereinafter with reference to FIGS. 4–6.

The quarter wave transmission line 310 transforms a nominally low impedance R_L into $(Z\_m)^2/R\_L$. By selecting a suitable value for Z_m, the second amplifier 120 delivers higher efficiency. In other words, the efficiency of the second amplifier 120 is increased. The value for Z_m can be selected to suit the requirements of a particular application.

In this embodiment, the impedance matching mechanism 230 is implemented with an impedance matching network 340 that includes a plurality of shunt capacitors and a plurality of series inductors. For example, the plurality of series inductors can be implemented with a plurality of series of micro strip lines.

In this embodiment, the high power amplifier delivers the maximum power desired into a low impedance load. The low power amplifier delivers medium level power, but operates more efficiently with higher impedance. When the low power amplifier is not used, and the high power amplifier is on, a high impedance is required when looking from the high power amplifier into port Z1 of the transmission line 310. A high impedance is needed so that the power flows into the lower impedance load. This high impedance is achieved according to one embodiment of the invention by switching on the switch SW1, thereby bringing the impedance at port Z2 of the transmission line 310 down to a ground potential or level. Capacitor C1 is a bypass capacitor at a fundamental frequency such that the DC current is blocked. The transmission line 310 transforms the ground impedance into an open impedance at port Z1. The transmission line 310 further presents a second harmonic short to the high power amplifier to further improve the efficiency of the amplifier.

It is noted that the switchable load 130 according to one embodiment of the invention reduces the voltage swing at the drain electrode of the low power amplifier since the drain electrode is effectively shorted to an AC ground.

It is noted that the switchable load 130 according to one embodiment of the invention increases the efficiency of the low power amplifier by providing a suitable or proper second harmonic termination. Furthermore, the switchable load 130 according to one embodiment of the invention solves the problem of poor power back-off efficiency in power amplifiers due to sub-optimal load impedance and excessive output device size.

According to one embodiment of the invention, the power amplifier is implemented in a monolithic microwave integrated circuit (MMIC). According to another embodiment of the invention, the power amplifier is utilized in a code-division multiple access (CDMA) mobile handset. For example, the power amplifier according to the invention may be utilized in a code-division multiple access (CDMA) mobile handset that uses either Cellular mobile telephone frequencies or PCS mobile telephone frequencies.

Exemplary Quarter-Wave Transmission Line Implementations

Figure 4:
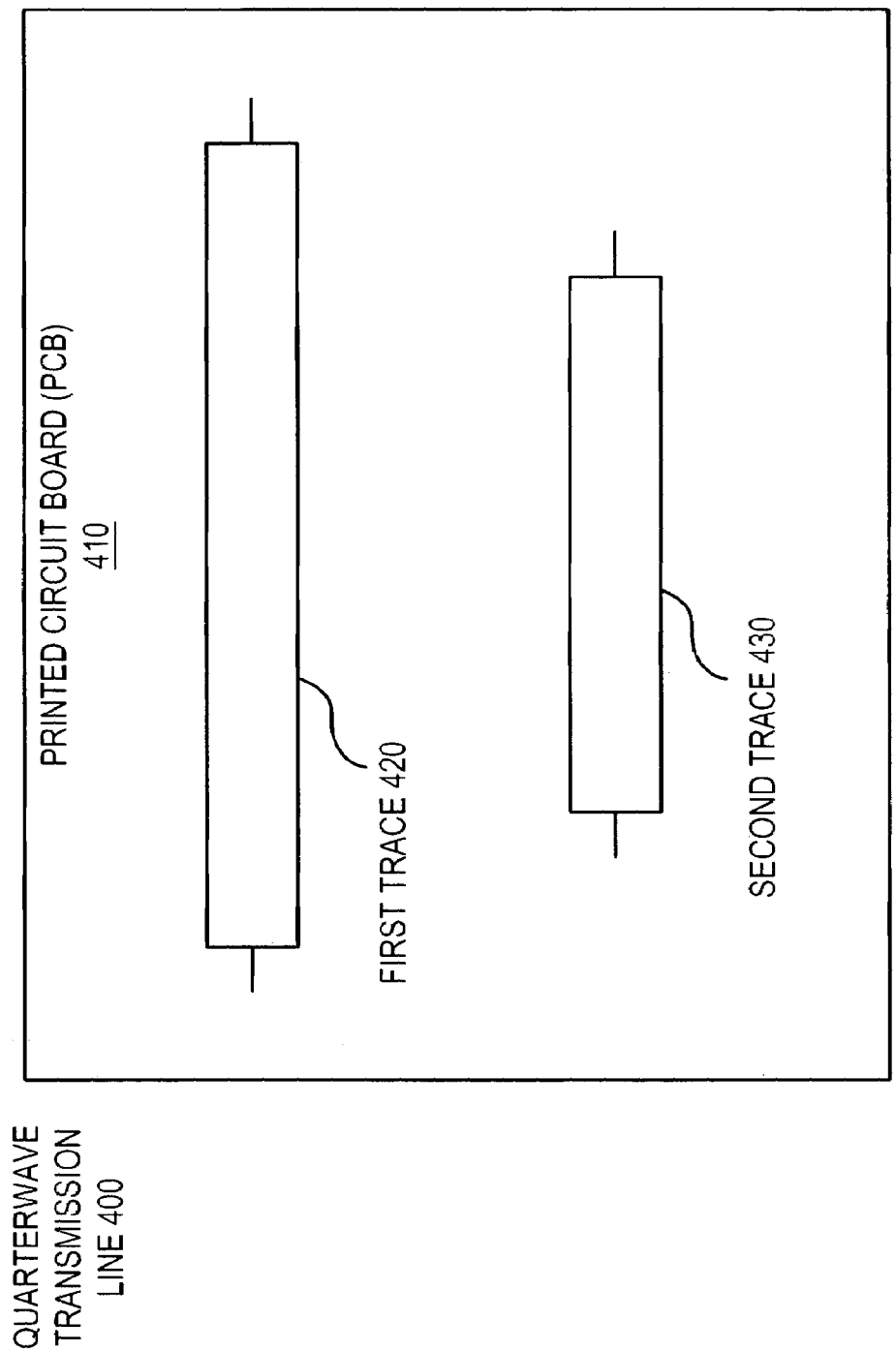
FIG. 4 illustrates a first exemplary implementation of the quarter-wave transmission line according to one embodiment of the invention.

FIG. 4 illustrates a first exemplary implementation of the quarter-wave transmission line 400 according to one embodiment of the invention. In this implementation, a low impedance quarterwave line 400 for Cellular and PCS mobile phone frequencies can be a trace on a printed circuit board (PCB) 410. The trace can be, for example, a first trace 420 or a second trace 430. The trace can be wide and very long. The trace length and trace width can be selected to suit the requirements of a particular application. In one embodiment, a trace length in the range of about 0.8 inches to about 3.2 inches and a trace width in the range of about 0.05 inches to about 0.1 inches are utilized for PCS frequencies. In another embodiment, a trace length in the range of about 1.6 inches to about 6.4 inches and a trace width in the range of about 0.05 inches to about 0.1 inches are utilized for Cellular frequencies.

Figure 5:
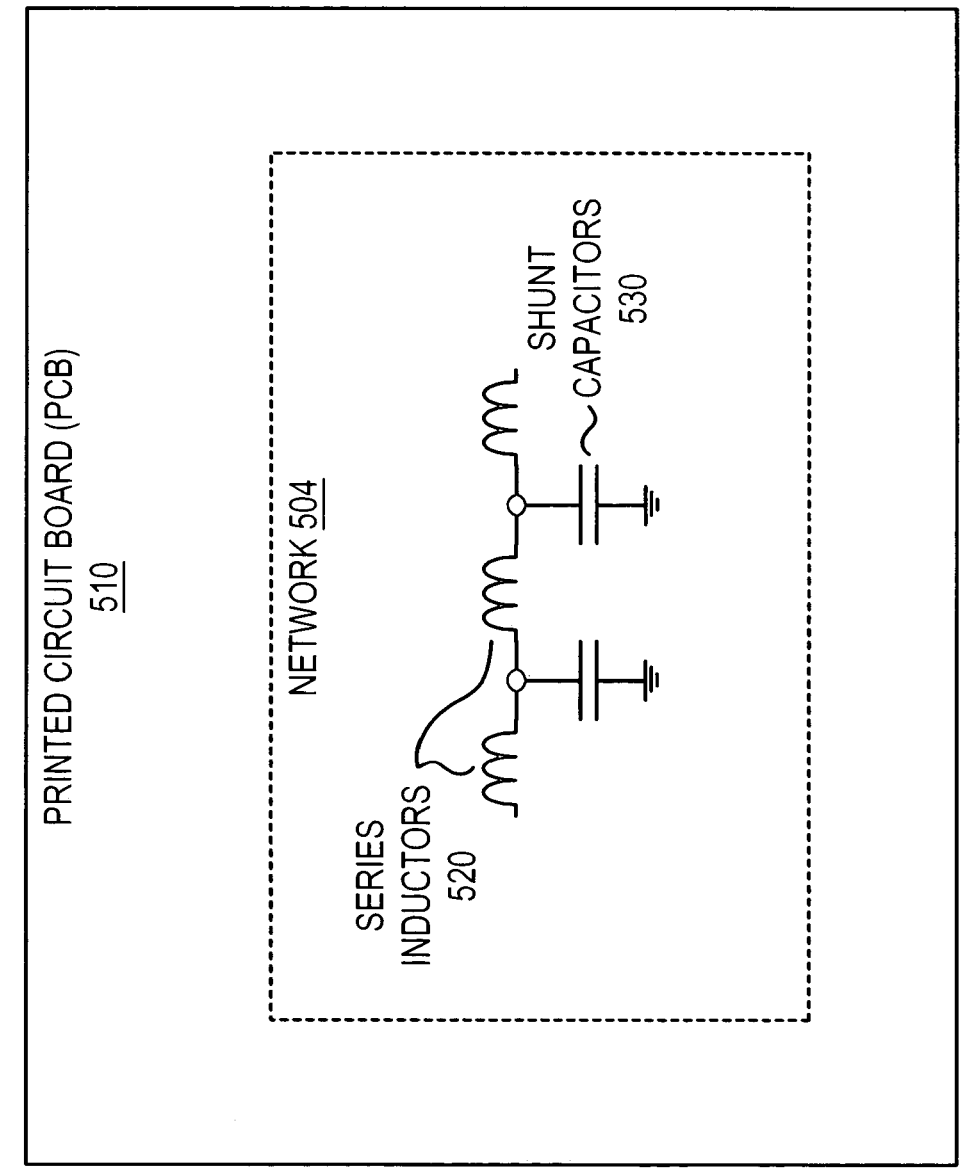
FIG. 5 illustrates a second exemplary implementation of the quarter-wave transmission line according to one embodiment of the invention.

FIG. 5 illustrates a second exemplary implementation of the quarter-wave transmission line 500 according to one embodiment of the invention. In this implementation, a network 504 of series inductors 520 and shunt capacitors 530 can be utilized to implement the quarter-wave transmission line 500. For example, the network 504 can include a first series inductor, a first shunt capacitor, a second series inductor, a second shunt capacitor, and a third series inductor. These components can be discrete components (e.g., surface mount technology (SMT) components) and can be mounted on a printed circuit board (PCB) 510.

Figure 6:
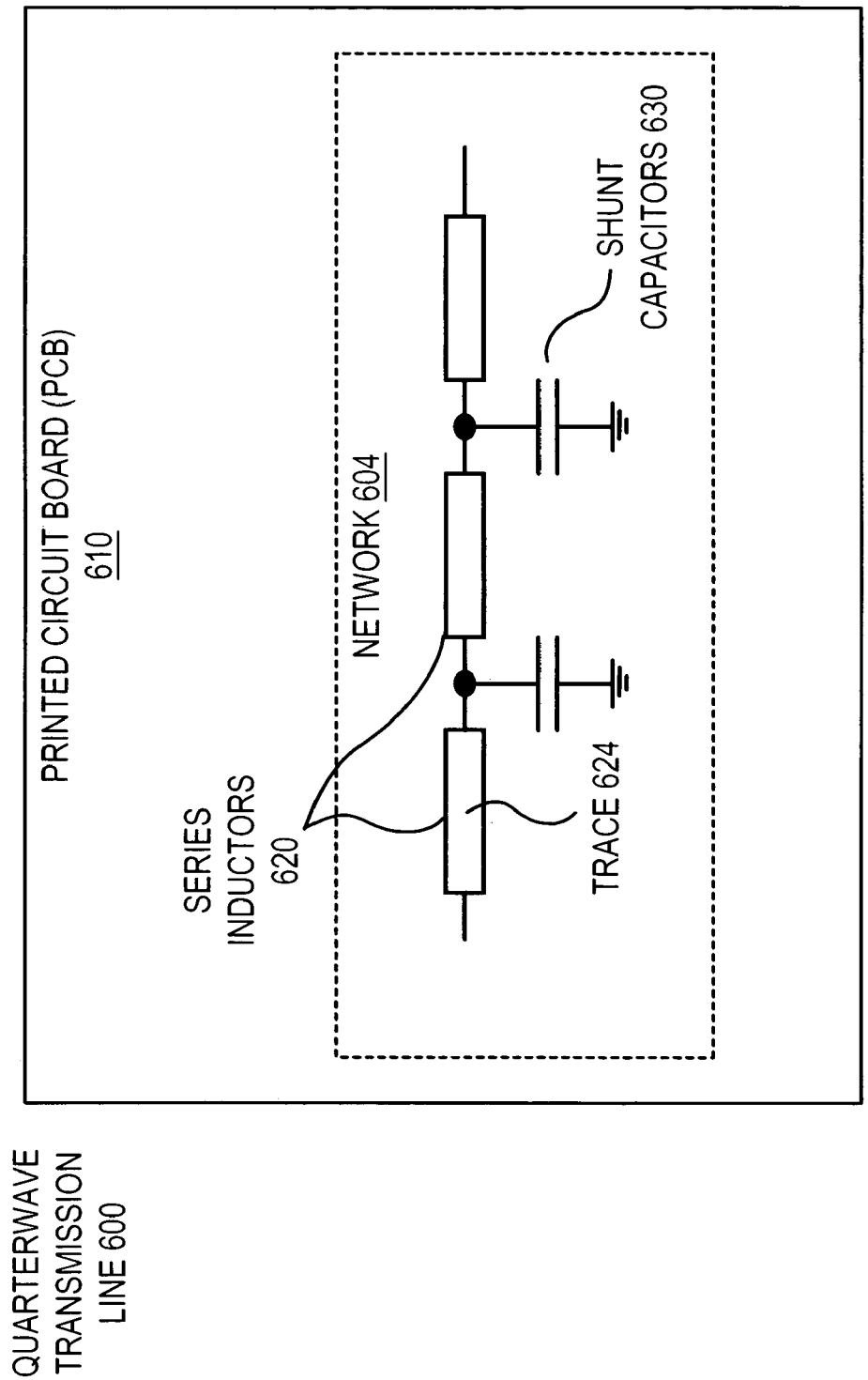
FIG. 6 illustrates a third exemplary implementation of the quarter-wave transmission line according to one embodiment of the invention.

FIG. 6 illustrates a third exemplary implementation of the quarter-wave transmission line 600 according to one embodiment of the invention. In this implementation, a network 604 of series inductors 620 and shunt capacitors 630 can be utilized to implement the quarter-wave transmission line 600. In this example, the network 604 includes a first series inductor, a first shunt capacitor, a second series inductor, a second shunt capacitor, and a third series inductor. The network 604 of series inductors 620 and shunt capacitors 630 is similar to the network 504 of series inductors 520 and shunt capacitors 530. However, the discrete inductors 520 of FIG. 5 are implemented by utilizing board traces 624 on the printed circuit board (PCB) 610. These traces 624 can be thin and winding traces on the PCB 610.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A power amplifier comprising:
   a first amplifier that includes an output electrode;
   a second amplifier that includes an output electrode; and
   a switchable load that includes a first electrode coupled to the output electrode of the first amplifier and a second electrode that is coupled to the output electrode of the second amplifier; wherein the switchable load is controlled by a signal that selectively presents a first impedance to the first amplifier when the first amplifier is operational, and the second amplifier is not utilized, and presents a second impedance to the second amplifier when the second amplifier is operational, and the first amplifier is not utilized; wherein the switchable load also includes a short preservation mechanism that preserves a second harmonic short.

2. The power amplifier of claim 1 wherein the switchable load includes
   a first amplifier impedance matching network that matches the load of the first amplifier; wherein the first amplifier impedance matching network is employed to present the first impedance; and
   a second amplifier impedance matching network that matches the load of the second amplifier; wherein the second amplifier impedance matching network is employed to present the second impedance.

3. The power amplifier of claim 1 wherein the switchable load includes
   a quarter-wave transmission line that includes a first electrode coupled to the output electrode of the first amplifier and a second electrode coupled to the output electrode of the second amplifier;
   a capacitor that includes a first electrode coupled to the second electrode of the quarter-wave transmission line and a second electrode; and
   a switch that includes a first electrode that is coupled to the second electrode of the capacitor and a second electrode that is coupled to a predetermined signal and a third electrode for receiving a control signal; wherein the switch selectively couples the first electrode of the switch to the predetermined signal.

4. The power amplifier of claim 3 wherein the quarter-wave transmission line includes a low impedance quarter-wave line.

5. The power amplifier of claim 3 wherein the quarter-wave transmission line includes a plurality of shunt capacitors and a plurality of discrete series inductors.

6. The power amplifier of claim 3 wherein the quarter-wave transmission line includes a plurality or shunt capacitors and a plurality of series inductors implemented as thin and winding board traces on a printed circuit board.

7. The power amplifier or claim 1 wherein the first amplifier includes a driver amplifier and a power amplifier.

8. The power amplifier of claim 7 wherein the driver amplifier includes a first field effect transistor (FET) and the power amplifier includes a second field effect transistor (FET).

9. The power amplifier of claim 1 wherein the second amplifier includes a driver amplifier and a power amplifier.

10. The power amplifier of claim 9 wherein the driver amplifier includes a first field effect transistor (FET) and the power amplifier includes a second field effect transistor (FET).

11. The power amplifier of claim 1 further comprising:
a load that is coupled to the switchable load.

12. The power amplifier of claim 11 wherein the load includes an impedance matching network that includes a plurality of shunt capacitors and a plurality of series inductors.

13. The power amplifier of claim 12 wherein the plurality of series inductors are implemented with a plurality of series of micro strip lines.

14. The power amplifier of claim 11 wherein the load includes an antenna.

15. The power amplifier of claim 1 wherein the power amplifier is implemented in a monolithic microwave integrated circuit (MMIC).

16. The power amplifier of claim 1 wherein the power amplifier is utilized in a code-division multiple access (CDMA) mobile handset.

17. The power amplifier of claim 1 wherein the power amplifier is utilized in a code-division multiple access (COMA) mobile handset that employs one of Cellular mobile telephone frequencies and PCS mobile telephone frequencies.

18. A switchable load apparatus comprising:
a quarter-wave transmission line that includes a first electrode for coupling to an output electrode of a first amplifier and a second electrode for coupling to an output electrode of second amplifier;
a capacitor that includes a first electrode coupled to the second electrode of the quarter-wave transmission line and a second electrode; and
a switch that includes a first electrode that is coupled to the second electrode of the capacitor and a second electrode that is coupled to a first predetermined signal and a third electrode for receiving a control signal; wherein the switch selectively couples the first electrode of the switch to the first predetermined signal.

19. The switchable load apparatus of claim 18 wherein the switchable load apparatus selectively presents a first impedance to the first amplifier when the first amplifier is operational, and the second amplifier is not utilized, and presents a second impedance to the second amplifier when the second amplifier is operational and the first amplifier is not utilized.

* * * * *

UNITED STATES PATENT AND TRADEMARK OFFICE
CERTIFICATE OF CORRECTION

PATENT NO.        : 7,135,919 B2
APPLICATION NO.   : 10/913051
DATED             : November 14, 2006
INVENTOR(S)       : Pin-fan Chen It is certified that error appears in the above-identified patent and that said Letters Patent is hereby corrected as shown below:

Column 6, Line 63, Claim 6, before "shunt" delete "or" and insert -- of --;

Column 6, Line 66, Claim 7, before "claim" delete "or" and insert -- of --;

Column 8, Line 3, Claim 17, delete "(COMA)" and insert -- (CDMA) --;

Column 8, Line 10, Claim 18, after "of" insert -- a --;

Column 8, Line 25, Claim 19, after "operational" insert -- , --.

Signed and Sealed this

Eighth Day of June, 2010

David J. Kappos
*Director of the United States Patent and Trademark Office*